United States Patent
Chu et al.

[11] 4,055,144
[45] Oct. 25, 1977

[54] APPARATUS FOR MENISCUS COATING OF A MOVING WEB

[75] Inventors: Simon L. Chu, Dobbs Ferry; Robert Sharowsky, Hastings-on-Hudson; Peter Shu, Yonkers, all of N.Y.

[73] Assignee: Polychrome Corporation, Yonkers, N.Y.

[21] Appl. No.: 666,814

[22] Filed: Mar. 15, 1976

[51] Int. Cl.² ............................................. B05C 5/02
[52] U.S. Cl. .............................. 118/401; 118/DIG. 2
[58] Field of Search .................. 118/DIG. 2, 401, 410, 118/259, 429; 401/120

[56] References Cited

U.S. PATENT DOCUMENTS

| | | | |
|---|---|---|---|
| 1,929,877 | 10/1933 | Bonamico | 118/401 X |
| 2,598,908 | 6/1952 | Grimson | 118/401 |
| 2,953,476 | 9/1960 | Armstrong | 118/259 X |
| 3,196,830 | 7/1965 | Lehovec | 118/401 |
| 3,863,600 | 2/1975 | Regenmortel | 118/429 X |
| 3,937,177 | 2/1976 | Lloyd | 118/429 X |

FOREIGN PATENT DOCUMENTS

| | | | |
|---|---|---|---|
| 726,114 | 1/1966 | Canada | 118/410 |
| 377,286 | 7/1932 | United Kingdom | 118/401 |
| 118,703 | 7/1958 | U.S.S.R. | 118/401 |

*Primary Examiner*—Robert R. Mackey

[57] ABSTRACT

A moving essentially non-porous web is positioned above and in close proximity to the upper surface of a narrow, very shallow pool of coating solution. A coating meniscus extends directly from the upper surface to the web to transfer coating solution from the pool to the web. Stagnation of solution in the pool is eliminated by feeding solution to the pool at the center and bottom thereof, and removing excess solution through ports at the top surface of the pool at each end thereof.

1 Claim, 5 Drawing Figures

APPARATUS FOR MENISCUS COATING OF A MOVING WEB

This invention relates to apparatus for meniscus coating of a moving web.

For the most part, coating processes for applying a thin film or coating to a continuously moving web of metal, or other essentially non-porous materials, are of the metered or non-metered types. These processes are often used in the manufacture of pre-sensitized lithographic printing plates by applying a coating of photographic liquid, such as diazo resin, on a thin substrate of aluminum or other suitable metal.

A metered type process is utilized where accurate control of coating thickness is essential so that apparatus for the metered type usually includes a special coating head that typically comprises a number of critically dimensioned elements to form a closely controlled gap or slot. Clearance between the coating head and web is very small and is critical. Thus, a metered type process requires relatively sophisticated equipment and experienced operating personnel. This equipment is expensive and is easily damaged during frequent disassembly for cleaning and other maintenance. Overall, a metered-type coating process is costly.

Non-metered coating processes, such as the dip-pan process, are limited not only by properties of the coating solution and by coating speed, but also by distribution of coating solution to the coating pan. That is, the solution stagnates at certain regions of pan and interferes with the application of a continuously uniform, streak-free coating on the moving web.

In accordance with the instant invention, meniscus coating of a moving web is achieved by utilizing a very shallow pool of coating solution confined in a pan that is constructed to prevent stagnation of the coating solution thereby improving coating quality.

Accordingly, a primary object of this invention is to provide novel apparatus for applying a coating solution to a continuously moving web of relatively non-porous material.

Another object is to provide apparatus of this type that is economical and which will applly a uniform streak-free coating.

Still another object is to provide apparatus of this type that operates on a principal which includes a meniscus formed directly between a pool of the coating solution and a web moving above the upper surface of the pool.

A further object is to provide apparatus of this type in which the coating solution is fed to the moving web from a very shallow pool confined in a pan that is constructed to prevent stagnation.

A still further object is to provide apparatus of this type in which the pool is very narrow as compared with the diameter of a roller supporting the moving web in the meniscus region.

These objects as well as other objects of this invention shall become readily apparent after studying the following description of the accompanying drawings in which.

Figure 1:
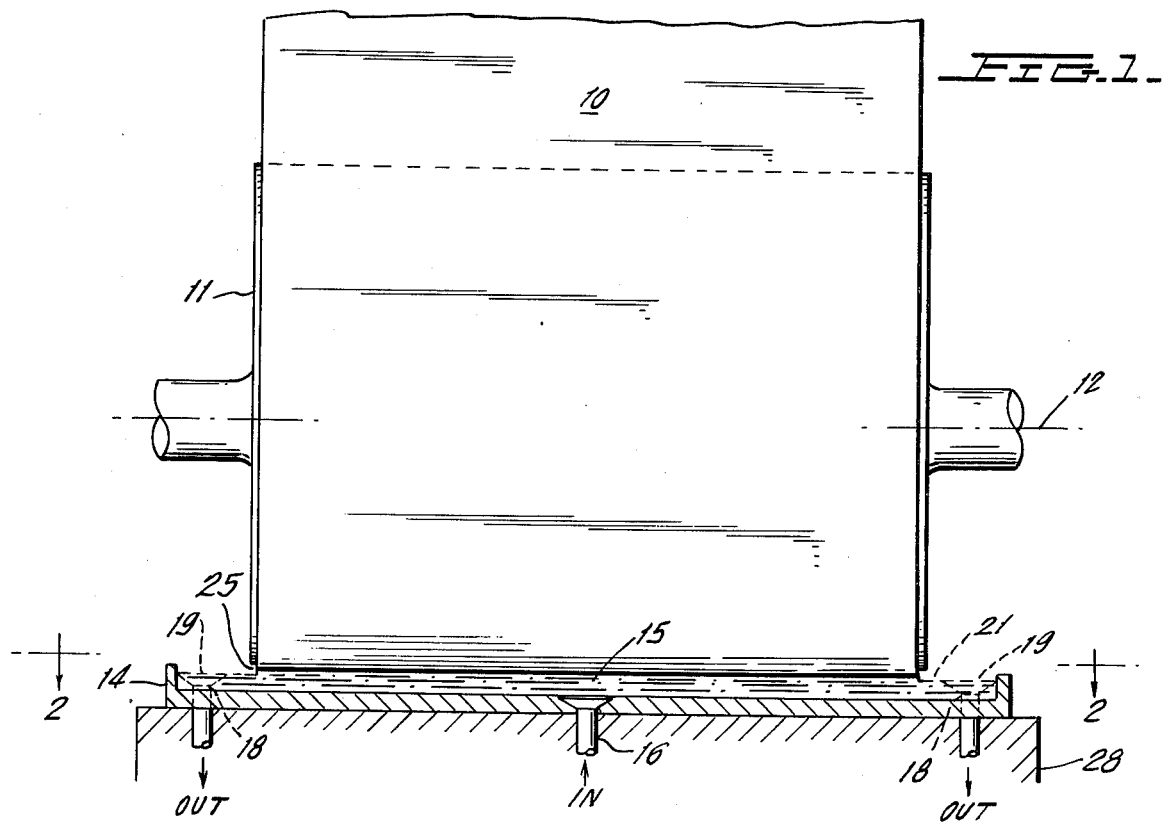
FIG. 1 is a side elevation, in schematic form, of apparatus constructed in accordance with teachings of the instant invention.
Figure 2:
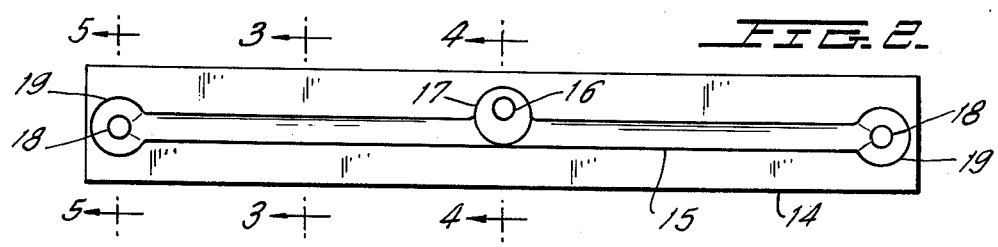
FIG. 2 is a plan view of the shallow pan looking in the direction of arrows 2,2 of FIG. 1.
Figure 3:
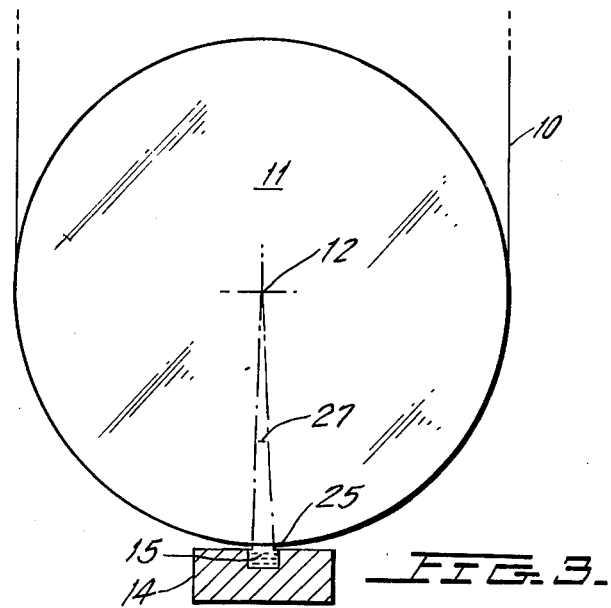
Figure 4:
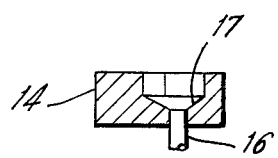
Figure 5:
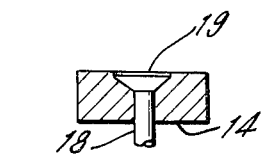

FIGS. 3, 4 and 5 are cross-sections of the shallow pan taken through the respective lines 3,3 4,4 and 5,5 of FIG. 2 looking in the direction of arrows 4,4.

Now referring to the figures. Continuously moving metal web 10 is partially wrapped around elongated support roller 11 mounted for rotation about its longitudinal axis 12 which is positioned horizontally. Roller 11 is positioned above pan 14 wherein narrow, shallow pool 15 of a coating solution is confined. Coating solution is fed to pool 15 through inlet tube 16 at enlarged port 17 provided to reduce turbulence. Port 17 is located at the bottom of pool 15 midway between the ends thereof. Some of the fluid entering pool 15 at port 17 exits through two enlarged ports 19 connected to a return reservoir (not shown) by tubes 18 located at opposite ends of pool 15. Ports 19 extend to the upper surface 21 of pool 15. The inlet and outlet ports, as observed in FIGS. 2 and 3, are positioned in a plane containing a longitudinally extending groove within the pan and the longitudinal axis of said pan.

Roller 11 positions web 10 so that it passes above upper surface 21 in close proximity thereto. A bridge or meniscus 25 of coating solution is formed directly between upper pool surface 21 to web 10. Meniscus 25 is maintained as web 10 moves by solution entering pool 15 through inlet 16. At start-up, meniscus 25 is formed by utilizing a plastic strip (not shown).

Generally, the diameter of roller 11 should be at least four times the width of pool 15 at its upper surface 21 and preferably roller diameter should be between five and six times pool width at its upper surface.

In a practical example, web 10 is 60 inches wide and support roller 11 is 14 inches in diameter. Contact between coating meniscus 25 and web 10 is limited to an angle 27 (FIG. 3) of no more than 20° and spacing between web 10 and upper pool surface 21 is in the range of 15 to 35 mils. The latter is adjustable by raising and lowering horizontal table 28 which supports pan 14.

Pan 14 may be milled from an aluminum block 63 inches long by 5 inches wide by ½ inches high. Pool 15 is 61 inches long by 3 inches wide, at upper surface 21, by slightly less than one-quarter inch high. This height may be reduced to one-eighth inch. While pool 15 is illustrated as being generally of uniform width, this width may be narrower at the ends than at the center. Further, the bottom of pool 15 may be rounded.

Tubes 16 and 18 are one-quarter inch in diameter and ports 17 and 19 are one-half inch. Overflow at ports 19 is 5% of solution infeed at port 17.

Although in the foregoing, a preferred embodiment has been discussed, many variations and modifications will now become apparent to those skilled in the art and it is therefore understood that this invention is not limited by the disclosure but only by the appending claim.

We claim:

1. Apparatus for coating a moving surface of aluminum substrate which comprises:
    a. a pan having a longitudinally extending groove at the upper surface thereof, capable of containing a relatively elongated, shallow pool of a light sensitive coating solution;
    b. level regulating fluid flow means interior to said pan continually supplying said coating solution to said pan in the absence of substantial turbulence at a rate at least 5% in excess of that required to support a meniscus between a surface of said aluminum substrate and the upper level of said pool, and evacuating a portion of said coating solution from said pan while maintaining the elevation of said coating solution at a substantially constant level, said fluid flow regulating means comprising at least one enlarged disturbance damping fluid inlet port located midway between the ends of the pan at the bottom level of said pan and at least two outlet ports located at the ends of the pan at the top level of said pan, said inlet and outlet ports being positioned in a plane containing said longitudinally extending groove and the longitudinal axis of said pan;

c. a roller, having a diameter at least four times the width of said pool at its upper surface, which supports said aluminum substrate by engaging one surface thereof to position the other side of said aluminum substrate close to and above the upper surface of said pool such that the space between said aluminum substrate and the upper pool surface is in the range of 15 to 35 mils; and d. a menicus of said coating solution extending from the upper surface of said aluminum substrate such that the arc of aluminum substrate contacted by said meniscus of coating solution subtends an angle of no more than 20° measured from the longitudinal axis of said roller.

* * * * *